United States Patent [19]

Jaeschke

[11] Patent Number: 4,480,201
[45] Date of Patent: Oct. 30, 1984

[54] DUAL MODE POWER TRANSISTOR

[75] Inventor: James R. Jaeschke, Waukesha, Wis.

[73] Assignee: Eaton Corporation, Cleveland, Ohio

[21] Appl. No.: 390,486

[22] Filed: Jun. 21, 1982

[51] Int. Cl.³ .................... H03K 17/04; H03K 17/12; H03K 17/68; H03K 17/687
[52] U.S. Cl. .................................. 307/570; 307/575; 307/362; 307/577; 307/270
[58] Field of Search ............... 307/495, 499, 501, 354, 307/362, 544, 548, 554, 570–575, 577, 584, 264, 270, 297; 363/60; 323/284, 289

[56] References Cited

U.S. PATENT DOCUMENTS

| 4,055,794 | 10/1977 | Ickes et al. | 323/289 |
| 4,149,098 | 4/1979 | Wright | 307/270 X |
| 4,215,279 | 7/1980 | Lataire et al. | 307/270 X |
| 4,286,175 | 8/1981 | Baker | 307/581 |

Primary Examiner—Stanley D. Miller
Assistant Examiner—David R. Hudspeth

Attorney, Agent, or Firm—Andrus, Sceales, Starke & Sawall

[57] ABSTRACT

A dual mode power transistor circuit is provided for optimizing ON state dissipation, base drive requirements, and switching speed in applications subject to large overload currents for short periods of time. The circuit has dual modes or regions of operation: (1) rated current and below; and (2) overload current. In the overload region, additional base drive is supplied to the bipolar power transistor while also keeping such transistor in its active region, out of saturation, to enable fast turn-off. The additional base drive is supplied at a given sensed current-induced threshold voltage and enables the transistor to conduct increased collector current therethrough, which in turn reduces the otherwise increased collector to emitter voltage. Turn-off power dissipation is substantially reduced, in spite of the increased collector current, due to the drastically reduced collector to emitter voltage. Particularly simple dual mode Darlington-like transistor circuitry is disclosed. Bidirectional dual mode transistor circuitry is also disclosed.

26 Claims, 6 Drawing Figures

DUAL MODE POWER TRANSISTOR

TECHNICAL FIELD

The invention relates to transistor circuits, and more particularly to power switching circuitry including a bipolar transistor that must handle large overload currents for short periods of time and enable quick turn-off of these currents.

BACKGROUND

Bipolar transistor switch design is a tradeoff between ON state power dissipation, base current drive, and fast switching speed. To obtain low dissipation, the power transistor must be driven heavily into saturation to provide minimum ON state power dissipation, i.e. low forward voltage drop. This requires large base drive circuitry. Additonally, this results in slow switching speed at turn-off.

In prior applications where the bipolar power transistor may be subject to large overload currents for short periods of time, turn-off may be achieved quickly, but the turn-off dissipation is extremely high due to the greatly increased voltage. Upon occurence of an overload current, the bipolar power transistor will conduct only the amount of collector current which is enabled by the level of base drive applied. The transistor does not pass the remaining overload current, and thus voltage across the transistor increases. This increasing voltage, with constant collector current, carries the transistor into its active region, which in turn enables fast turn-off.

In these prior circuit applications, the voltage across the bipolar power transistor is allowed to increase until the short circuit protective circuitry extinguishes the overload current. The voltage across the transistor thus attains a very high level which in combination with the constant maximum collector current determines the power dissipation.

In other approaches high levels of base drive are always supplied to guarantee transistor saturation, which results in excessive base circuit dissipation, a large base drive power supply, and slow switching speed.

Other approaches regulate base drive current in response to emitter current to reduce power dissipation, but the optimizing of turn-off time and ON state dissipation is not maintained.

SUMMARY

In the present invention, the current-induced voltage across a bipolar power transistor during overload is not allowed to increase above a designated threshold, but instead additional base drive is supplied to the transistor which in turn enables higher level current flow therethrough which in turn reduces the voltage thereacross, and regulates the voltage at the designated threshold. Though the current through the transistor is higher, the voltage thereacross is much lower, resulting in an overall lower power dissipation.

In applications where a bipolar power transistor carries normally rated current, but may be subjected to high overload currents for short periods of time before protective trip circuitry extinguishes the current, the present invention optimizes ON state power dissipation, low base drive requirements, and fast switching speed.

The present invention provides a dual mode power transistor circuit having two regions of operation: (1) normal rated current and below; and (2) overload current. The invention enables fast turn-off in the overload region with reduced power dissipation, while still affording low dissipation in the normal rated region.

In the rated current region, simple low current base drive circuitry drives a bipolar power transistor into saturation, reducing the ON state power dissipation and affording low forward voltage drop. In the overload region, means responsive to currents above the given rating supplies additional base drive for the bipolar transistor and also keeps the bipolar transistor in its active region, out of saturation, to enable fast turnoff. The amount of additional base drive is significant because too large an amount will only render the transistor in its saturated region, which is undesirable because of slow turn-off.

In one desirable aspect of the preferred embodiment, particularly simple and effective dual mode Darlington transistor circuitry is provided. The additional base drive for the bipolar power transistor is supplied through a second, Darlington connected transistor which is controlled by means responsive to currents above the given rating.

In preferred form, a voltage regulator senses current-induced voltage at the bipolar power transistor, and generates an output level dependent upon that voltage. The second transistor, which may be a FET, is biased into conduction by the output of the voltage regulator, to supply additional base drive to the bipolar power transistor. Higher level current is thus enabled through the bipolar power transistor, which in turn reduces the voltage thereacross, which voltage is regulated at a given threshold according to the feedback control provided through the voltage regulator and its level dependent output.

The invention further provides bidirectional dual mode transistor circuitry, including dual mode Darlington transistors.

DETAILED DESCRIPTION

Figure 1:
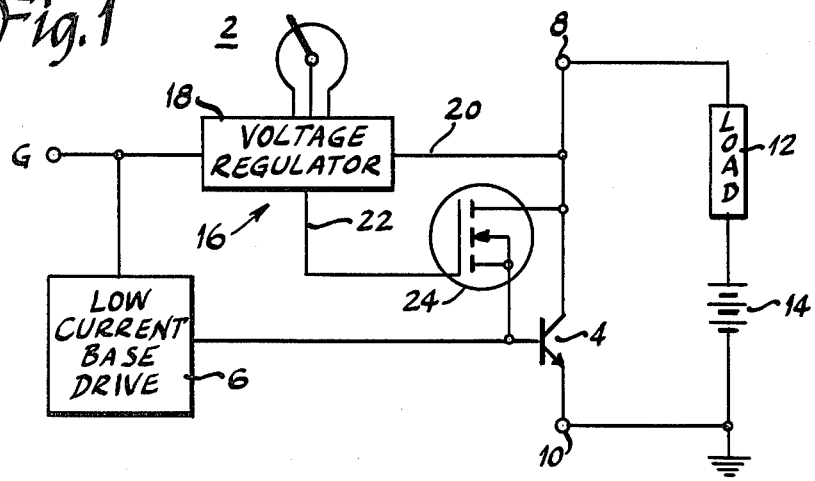
FIG. 1 is a schematic circuit diagram of a dual mode power transistor circuit constructed in accordance with the invention.

FIG. 1 shows a dual mode power transistor circuit 2 constructed in accordance with the invention for optimizing ON state dissipation, base drive requirements, and switching speed in applications subject to large overload currents for short periods of time. A bipolar power transistor 4 is biased by low current base drive means 6 into saturation for normally low level currents less than a given rating through transistor 4 between a pair of main terminals 8 and 10 through load 12 from power source 14. Saturation affords low ON state resistance and low forward voltage drop. Circuit means 16 responds to currents above the given rating to supply additional base drive for transistor 4 while also keeping transistor 4 in its active region, out of saturation, to enable fast turn-off.

In preferred form, circuit means 16 comprises voltage regulator means 18 having an input 20 connected to main terminal 8 and sensing current-induced voltage at bipolar transistor 4, and generating an output on line 22 in response to a given threshold of voltage at terminal 8. This output level on line 22 is dependent upon the current-induced sensed voltage across transistor 4 above the given threshold which corresponds to the given current rating. Circuit means 16 further includes a second transistor 24, such as a FET (field effect transistor), biased into conduction by the output on line 22 of voltage regulator 18. In preferred form, FET 24 is connected in Darlington-like configuration as shown in FIG. 1. Conduction of FET 24 supplies additional base drive to bipolar transistor 4 during collector currents above the given rating. The additional base drive is supplied from terminal 8 through FET 24 to the base of bipolar transistor 4.

The additional base drive to bipolar transistor 4 enables higher level collector current flow therethrough, which in turn reduces the voltage thereacross, which voltage is regulated at said given threshold by the feedback control afforded by voltage regulator 18 having its output level on 22 dependent upon the sensed current-induced voltage level on input 20.

Figure 2:
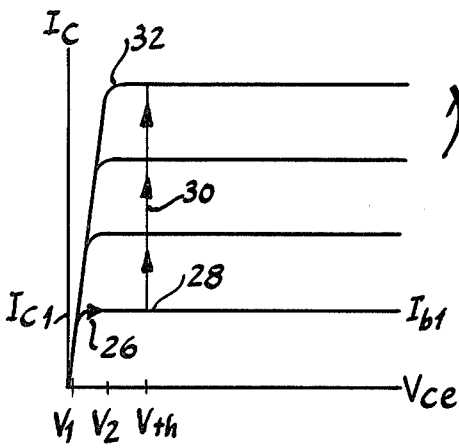
FIG. 2 is a graph plotting collector current $I_c$ versus collector to emitter voltage $V_{ce}$ across a bipolar transistor for various levels of base drive current $I_b$, showing the saturation region along the slope and showing the active region along the plateau for each different level of base drive current $I_b$.

Referring to FIG. 2, a low level base drive current $I_{b1}$ from base drive circuitry 6 provides the lower curve in the family of curves shown in the plot of collector current $I_c$ versus collector to emitter voltage $V_{ce}$. These transistor characteristics and the family of curves shown are well known.

In prior devices and in the present invention, transistor 4 is normally operated in its saturated region, which is the sloped initial portion of the curve. For example the collector to emitter voltage $V_{ce}$ may be at a level $V_1$ for normally low level currents less than a given rating. In this normal low level region, the switching speed of the bipolar power transistor is slow because of the saturation; but high switching speed is not needed in this region to keep the turn-off power dissipation within limits, due to the low level current and voltage.

In response to overload current, transistor 4 allows additional collector current therethrough up to the level $I_{c1}$, which is the maximum collector current allowed for the given base drive $I_{b1}$. If the overload current is greater than $I_{c1}$, then the transistor does not pass the additional overload current. This additional overload current instead causes the voltage across transistor 4 to increase, whereby the collector to emitter voltage $V_{ce}$ increases along the plateau region set by $I_{b1}$.

In prior devices, this voltage $V_{ce}$ is allowed to increase until the protective trip circuitry (not shown) extinguishes the overload current, all as is well known in the art. Turn-off can be achieved rapidly because transistor 4 is in its active region, i.e. the plateau region of the curve. However, turn-off power dissipation is extremely high due to the drastically increased voltage $V_{ce}$.

In the present invention, voltage regulator 18 responds to a given current-induced voltage threshold $V_{th}$ to generate an output on 22 which in combination with FET 24 enables application of additional base drive to bipolar transistor 4. In operation, when an overload current occurs, transistor 4 conducts additional collector current therethrough up to the level $I_{c1}$ as enabled by the given base drive current $I_{b1}$, as in prior devices. Transistor 4 does not pass additional overload current, and hence the voltage $V_{ce}$ thereacross begins to increase as shown at arrow 26. When the voltage $V_{ce}$ reaches the threshold level $V_{th}$, as shown at point 28, voltage regulator 18 generates its output and additional base drive is supplied to transistor 4.

This additional base drive translates transistor 4 to a different curve in the family in FIG. 2 and allows transistor 4 to pass a higher level collector current therethrough, as shown at arrows 30 extending upwardly. The higher collector current $I_c$ flowing through transistor 4 reduces the voltage thereacross from an otherwise higher value of $V_{ce}$. The voltage across transistor 4 is regulated at $V_{th}$ due to the feedback control afforded by voltage regulator 18 and its output 22 which is level dependent upon the input 20.

$V_{th}$ is selected at a level which insures that the additional base drive supplied to transistor 4 also keeps transistor 4 in its active region on the plateau of the curves, out of saturation on the sloped regions. In FIG. 2, $V_{th}$ should be greater than about $V_2$ which corresponds to the inflection point or knee 32 of the top $I_b$ curve. If $V_{th}$ is less than $V_2$, then the additional base drive supplied will not keep transistor 4 out of saturation, resulting in undesired slow turn-off.

Transistor circuit 2 thus has dual modes of operation. A first mode operates at normally low level currents below a given rating. A second mode operates in an overload region at currents above a given rating corresponding to a current-induced voltage threshold level $V_{th}$. The low level mode requires only simple low current base drive circuitry and affords low ON state voltage drop and dissipation due to the saturated conduction condition of transistor 4. The overload mode affords fast switching speed for turn-off, since transistor 4 is in its active region, thus enabling the overload condition to be quickly extinguished by known trip circuitry.

Turn-off power dissipation is substantially reduced due to the drastically decreased voltage $V_{ce}$ across transistor 4 at turn-off. The collector current $I_c$ through transistor 4 is at a higher level at turn-off than prior devices, but this is more than offset by the substantially greater reduction in voltage $V_{ce}$.

Figure 3:
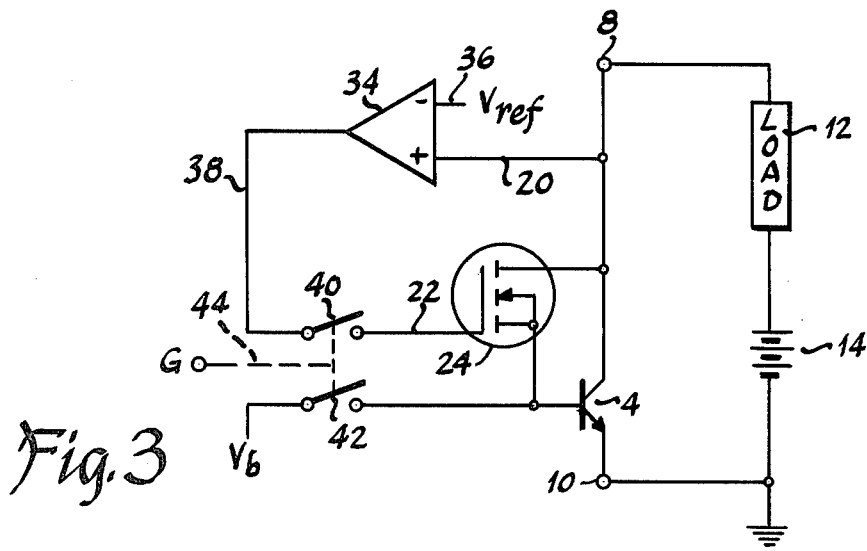
FIG. 3 is a more detailed schematic circuit diagram of the circuit of FIG. 1.

In the preferred embodiment in FIG. 1, bipolar power transistor 4 is an NPN transistor having its collector connected to main terminal 8 and its emitter connected to main terminal 10. Voltage regulator 18 and the second transistor 24 are each connected to main terminal 8. Voltage regulator 18 preferably comprises an amplifier 34, FIG. 3, having one input 20 connected to main terminal 8 and having another input 36 connected to a reference voltage which sets the above noted threshold voltage $V_{th}$. When the voltage level at input 20 rises above the voltage at input 36, amplifier 34 outputs a corresponding voltage level on line 38 dependent upon the voltage level on line 20 above the reference voltage. The amplifier output level increases with increasing voltage levels on input 20 above the reference level on input 36. Voltage regulator 18 further includes switch means 40 for applying the output of amplifier 34 to the gate of FET 24. FET 24 has its drain connected to main terminal 8 and its source connected to the base of bipolar transistor 4. The gate of FET 24 is connected to output line 22. Low current base drive means 6 comprises switch means 42 for applying base drive voltage $V_b$ to the base of bipolar transistor 4.

Figure 4:
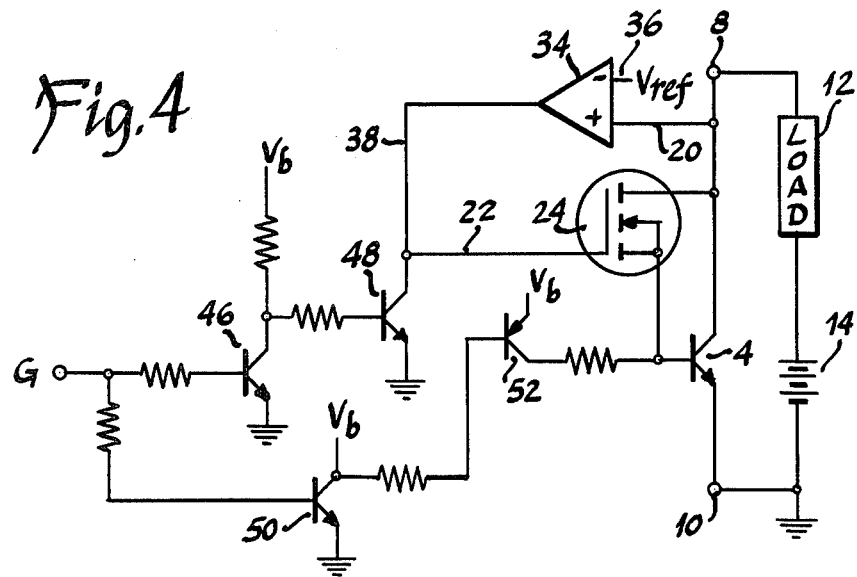
FIG. 4 is a yet more detailed schematic circuit diagram of the circuit of FIG. 1.

Switches 40 and 42 are both controlled by gate means 44 as driven by gate terminal G. In one form, switch means 40 comprises a transistor 46, FIG. 4, driven into conduction from gate terminal G to pass current therethrough from base drive voltage source $V_b$, which removes or diverts base drive from another transistor 48, rendering the latter nonconductive. Nonconduction of transistor 48 blocks the flow therethrough of the output signal on line 38, such that the output from amplifier 34 on line 38 is instead applied to the gate of FET 24, driving FET 24 into conduction. Switch means 42, FIG. 3, comprises a transistor 50, FIG. 4, base driven into conduction from gate terminal G, which conduction biases another transistor 52 into conduction, which conduction applies base drive voltage $V_b$ to the base of bipolar transistor 4.

Figure 5:
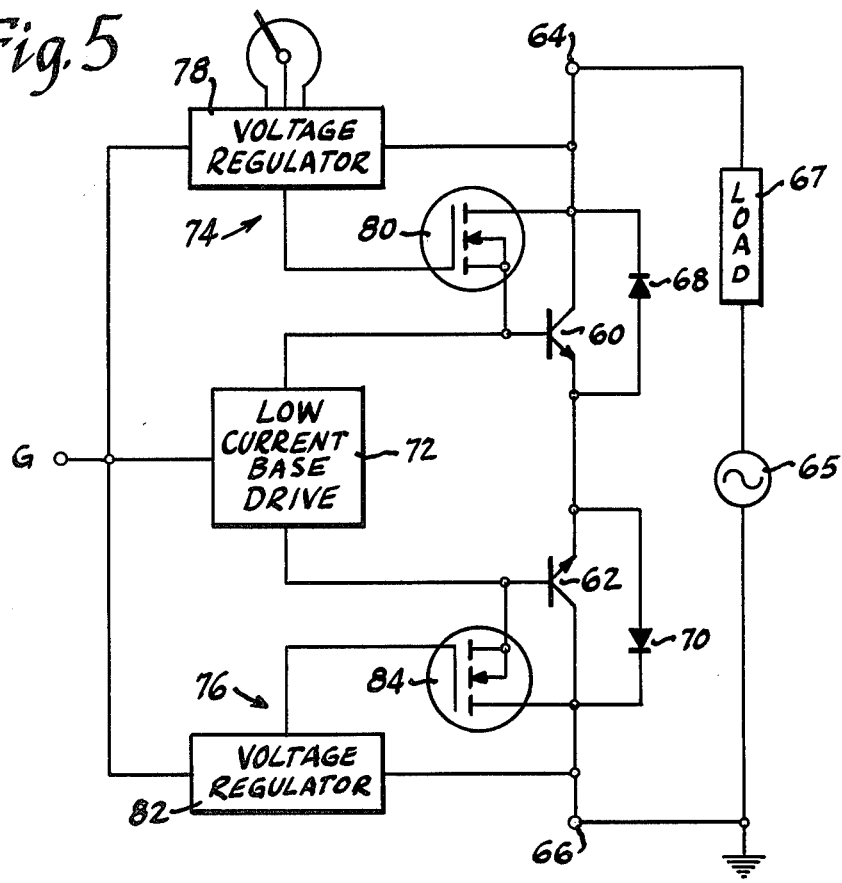
FIG. 5 is a schematic circuit diagram of a bidirectional dual mode power transistor circuit constructed in accordance with the invention.

FIG. 5 shows the preferred embodiment of a dual mode bidirectional power transistor circuit constructed in accordance with the invention for optimizing ON state dissipation, base drive requirements, and switching speed in applications subject to large overload currents for short periods of time. First and second bipolar NPN power transistors 60 and 62 are connected in series opposition between a pair of main terminals 64 and 66 in an AC load line having an AC power source 65 and a load 67. A pair of diodes 68 and 70 are provided, each connected in reverse parallel with a respective one of the bipolar transistors 60 and 62. In the ON state, current flows in a first direction from terminal 64 through transistor 60 and through diode 70 to main terminal 66. In the reverse direction, current flows from main terminal 66 through transistor 62 and through diode 68 to main terminal 64.

The bipolar power transistors 60 and 62 are biased by low current base drive means 72 into saturation for normally low level currents less than a given rating therethrough between main terminals 64 and 66, whereby to afford low forward voltage drop. First circuit means 74 is responsive to currents above the given rating to supply additional base drive to bipolar transistor 60 and also to keep bipolar transistor 60 in its active region, out of saturation, to enable fast turn-off. Second circuit means 76 is responsive to currents above the given rating to supply additional base drive for bipolar transistor 62 and also to keep transistor 62 in its active region, out of saturation, to enable fast turn-off.

In preferred form, each of the circuits 74 and 76 comprises voltage regulator means and transistor means, as above. Circuit 74 includes a first voltage regulator 78, comparable to voltage regulator 18, and a third transistor 80, comparable to transistor 24. Circuit 76 includes a second voltage regulator 82, comparable to voltage regulator 18, and a fourth transistor 84, comparable to transistor 24.

Voltage regulator 78 is connected to main terminal 64 and senses current-induced voltage at bipolar transistor 60, and generates an output in response to a given threshold of the voltage. Third transistor 80, such as a FET, is biased into conduction by the output of the voltage regulator 78 applied to its gate. Conduction of FET 80 supplies additional base drive to bipolar transistor 60. The additional base drive enables transistor 60 to conduct increased collector current therethrough, which in turn reduces the collector to emitter voltage thereacross, and regulates such voltage at the given threshold due to the feedback control provided through voltage regulator 78 and its output level dependent on the sensed current-induced voltage.

Voltage regulator 82 is connected to main terminal 66 and senses current-induced voltage at bipolar transistor 62 and generates an output in response to a given threshold of the voltage. Fourth transistor 84, such as a FET, is biased into conduction by the output of voltage regulator 82 applied at its gate. Conduction of FET 84 supplies additional base drive to the base of bipolar transistor 62 from main terminal 66. This additional base drive enables transistor 62 to conduct increased collector current, which in turn reduces and regulates the voltage thereacross to the threshold voltage level according to the feedback control provided through voltage regulator 82. As before, the threshold voltage $V_{th}$ is chosen at a level to insure that transistor 62 will be kept in its active region on the plateau of the $I_b$ curve. As before, turn-off dissipation is substantially reduced, in spite of the increased collector current, because of the greater decrease in collector to emitter voltage.

Figure 6:
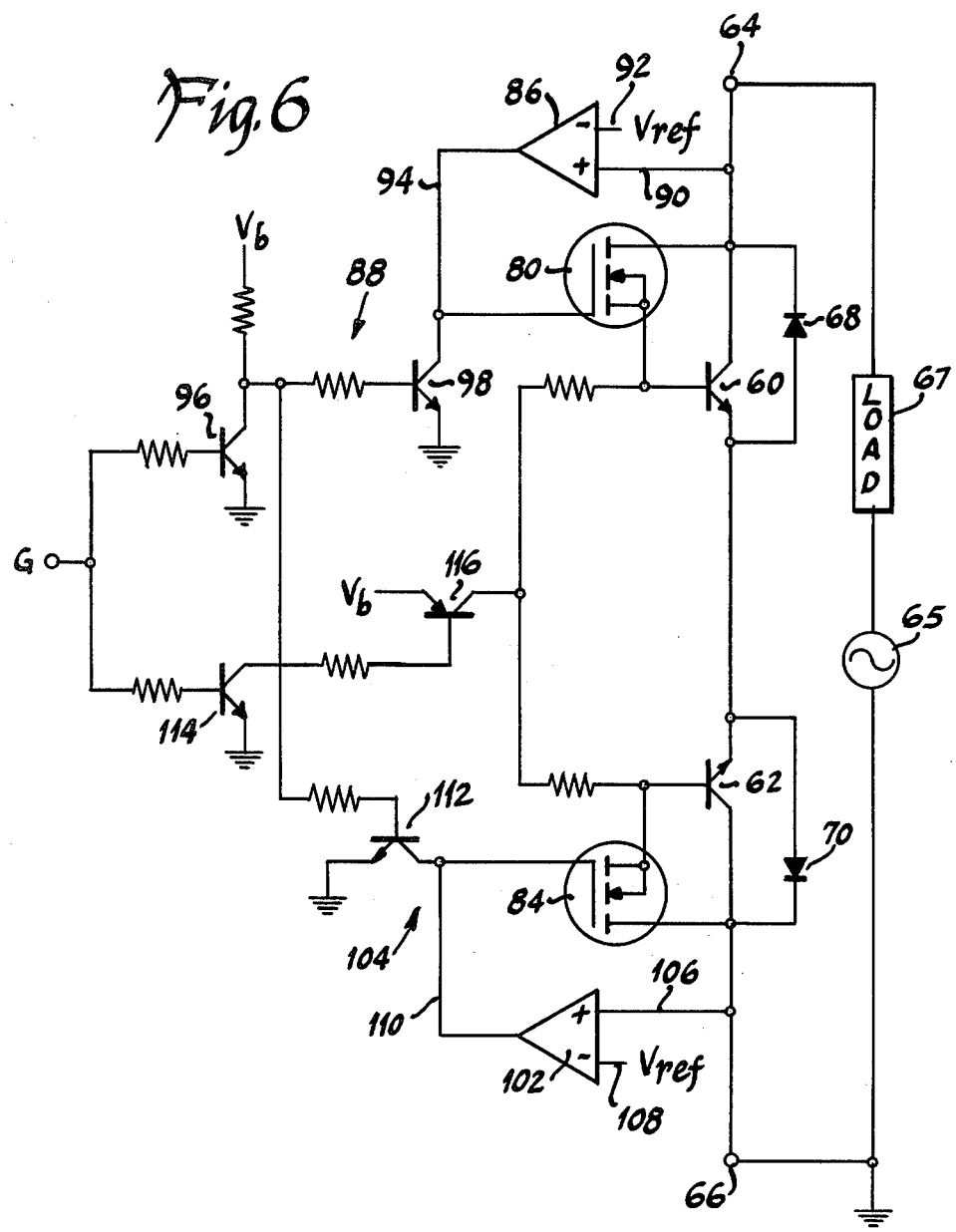
FIG. 6 is a more detailed schematic circuit diagram of the circuit of FIG. 5.

Referring to FIG. 6, voltage regulator 78 comprises amplifier 86 and switch means 88 for controlling application of the output of amplifier 86 to the gate of FET 80. Amplifier 86 has one input 90 connected to main terminal 64, and another input 92 connected to a reference voltage which sets the above noted threshold voltage. When the voltage level at input 90 rises above that at input 92, amplifier 86 generates an output signal on line 94. Switch means 88 comprises a transistor 96 base driven into conduction from gate terminal G to pass current therethrough from base drive voltage source $V_b$, which removes base drive from another transistor 98, rendering the latter nonconductive. Nonconduction of transistor 98 blocks the flow therethrough of the output signal on line 94, such that the output from amplifier 86 on line 94 is applied instead to the gate of FET 80, driving FET 80 into conduction.

Voltage regulator 82 comprises amplifier 102 and switch means 104 controlling application of the output of amplifier 102 to the gate of FET 84. Amplifier 102 has one input 106 connected to main terminal 66, and has another input 108 connected to the reference voltage to set the threshold voltage. When the voltage level at input 106 rises above that at input 108, amplifier 102 generates an output signal on line 110. Switch means 104 comprises a transistor 112 whose base drive is removed upon conduction of transistor 96. Nonconduction of transistor 112 blocks passage therethrough of the output from amplifier 102, whereby the output signal on line 110 instead is applied to the gate of FET 84, rendering the latter conductive.

Low current base drive means 72 comprises a transistor 114 base driven into conduction from gate terminal G, which conduction biases another transistor 116 into conduction, which in turn supplies base drive voltage $V_b$ to the bases of bipolar power transistors 60 and 62, rendering them conductive.

It is recognized that various modifications are possible within the scope of the appended claims.

I claim:

1. A dual mode power transistor circuit having a saturation mode and an active region mode for optimizing ON state power dissipation, base drive requirements, and switching speed in applications subject to large overload currents for short periods of time, comprising:

a bipolar power transistor biased by base drive means into saturation for normally low level load currents less than a given value therethrough between a pair of main power terminals connectable to a power source through a load, the emitter and collector of said transistor being connected to respective said main terminals; and means responsive to load currents above said given value to supply additional base drive for said bipolar transistor while also keeping said bipolar transistor in its active region, out of saturation, to enable fast turnoff.

2. The invention according to claim 1 wherein said last mentioned means comprises;

voltage regulator means sensing current-induced voltage at said bipolar transistor, and generating an output in response to a given threshold of said voltage; and a second transistor biased into conduction by said output of said voltage regulator means to supply said additional base drive for said bipolar transistor at a level keeping the latter out of saturation and in its active region.

3. The invention according to claim 2 wherein said voltage regulator means and said second transistor are each connected to one of said main terminals.

4. The invention according to claim 3 wherein said voltage regulator means comprises differential amplifier means having one input connected to said one main terminal, and having another input connected to a reference voltage setting said threshold, such that said differential amplifier means generates an output when the voltage level on its said one input rises above the reference voltage level on its other said input, said output of said differential amplifier means being said output of said voltage regulator means.

5. The invention according to claim 4 wherein said amplifier means output level increases with increasing voltage levels on said one input above said reference level, such that said second transistor enables increased base drive for said bipolar transistor whereby the latter enables increased current flow therethrough to thus reduce the voltage thereacross back to said given threshold.

6. The invention according to claim 5 wherein said voltage regulator means further comprises switch means for connecting said output of said amplifier means to said second transistor for biasing the latter into conduction when said amplifier means generates said output, said switch means having a switch control input terminal for receiving a switch control signal for actuating said switch means.

7. The invention according to claim 6 wherein said base drive means comprises second switch means for connecting said base drive means to the base of said bipolar transistor for biasing the latter into conduction, said second switch means having a second switch control input terminal for receiving a switch control signal for activating said second switch means, and comprising a gate terminal coupled to both of said switch control input terminals for actuating both said switches.

8. The invention according to claim 7 wherein said second transistor comprises a FET having one of its source and drain connected to said one main terminal, and the other of its source and drain connected to said base of said bipolar transistor at a point between said base and said second mentioned switch means, and having its gate connected to said first mentioned switch means.

9. The invention according to claim 8 wherein said first mentioned switch means comprises a transistor driven into conduction by a gate signal input voltage from said gate terminal, which conduction lowers the voltage at one of the emitter and collector of said last mentioned transistor, which lowered voltage reduces the base drive of another transistor having its base connected to said one of said emitter and collector of said last mentioned transistor such that said other transistor is switched to a state of nonconduction and blocks current flow therethrough between its emitter and collector such that the voltage at one of said last mentioned emitter and collector rises and biases said second mentioned transistor into conduction.

10. The invention according to claim 8 wherein said second mentioned switch means comprises a transistor driven into conduction from a gate terminal, which conduction biases another transistor into conduction which in turn enables application of said base drive voltage to the base of said bipolar transistor.

11. The invention according to claim 1 wherein said last mentioned means comprises voltage regulator means sensing current-induced voltage at said bipolar transistor, and generating an output in response to a given threshold of said voltage, and comprising means responsive to said output to supply said additional base drive to said bipolar transistor such that said bipolar transistor enables higher current there through, to regulate the voltage thereacross at said given threshold for reduced turn-off power dissipation.

12. A dual mode power transistor circuit having a saturation mode and an active region mode for optimizing ON state power dissipation, base drive requirements, and switching speed in applications subject to large overload currents for short periods of time, comprising:

a bipolar transistor biased by base drive means into saturation for normally low level load currents less than a given value therethrough between a pair of main power terminals connectable to a power source through a load, the emitter and collector of said transistor being connected to respective said main terminals, whereby to afford low forward collector-emitter voltage drop; and means responsive to load currents above said given value to supply additional base drive for said bipolar transistor such that higher level currents are allowed through said bipolar transistor which in turn regulates the voltage thereacross at a given threshold value, said additional base drive also keeping said bipolar transistor in its active region, out of saturation, to enable fast turn-off.

13. A dual mode Darlington-like transistor circuit having a saturation mode and an active region mode for optimizing ON state power dissipation, base drive requirements, and switching speed in applications subject to large overload currents for short periods of time, comprising:

a bipolar power transistor biased by base drive means into saturation for normally low level load currents less than a given value therethrough between a pair of main power terminals connectable to a power source through a load, the emitter and collector of said transistor being connected to respective said main terminals, whereby to afford low forward collector-emitter voltage drop;

a second transistor connected between one of said main terminals and the base of said bipolar transistor; and means connected to said bipolar transistor and responsive to load currents above said given value to bias said second transistor into conduction to supply additional base drive from said one main terminal through said second transistor to said base of said bipolar transistor for allowing higher current flow therethrough which in turn reduces the otherwise increased voltage level thereacross and regulates said voltage at a given threshold, said additional base drive also keeping said bipolar transistor in its active region, out of saturation, to enable fast turn-off.

14. The invention according to claim 13 wherein said last mentioned means comprises voltage regulator means connected to said one main terminal and sensing current-induced voltage thereat, and generating an output level dependent on said voltage, whereby to afford negative feedback regulated control of said voltage across said bipolar power transistor, and provide reduced turn-off power dissipation.

15. A dual mode bidirectional power transistor circuit for conducting current in both directions therethrough, including AC application, and having a saturation mode and an active region mode for optimizing ON state power dissipation, base drive requirements, and switching speed in applications subject to large overload currents for short periods of time, comprising:

a pair of bipolar power transistors connected in series opposition between a pair of main power terminals connectable to a power source through a load;

a pair of diodes, each connected in reverse parallel with a respective one of said power transistors, such that current flow in one direction between said main terminals traverses between the collector and emitter of the first of said bipolar transistors in an ON state and then from the anode to cathode of the second of said diodes, and such that current flow in the opposite direction between said main terminals traverses between the collector and emitter of the second of said bipolar transistors in an ON state and then from the anode to cathode of the first of said diodes;

base drive means for biasing said transistors into saturation for normally low level load currents less than a given value therethrough between said pair of main terminals, whereby to afford low forward collector-emitter voltage drop; and means responsive to currents above said given value to supply additional base drive for said bipolar power transistors, and keeping said bipolar power transistors in their active region, out of saturation, to enable fast turn-off.

16. The invention according to claim 15 wherein said last mentioned means comprises:

first means responsive to current through the first of said bipolar power transistors above said given rating to supply additional base drive for said first bipolar transistor to enable higher current therethrough which in turn reduces the otherwise increased voltage thereacross and regulates said voltage at a given threshold; and second means responsive to current through the second of said bipolar transistors above said given rating to supply additional base drive for said second bipolar transistor to enable higher current therethrough which in turn reduces the otherwise increased voltage thereacross and regulates said voltage at a given threshold.

17. The invention according to claim 16 wherein:

said first means comprises first voltage regulator means sensing current-induced voltage at the first of said bipolar transistors, and generating an output in response to a given threshold of said voltage; and said second means comprises second voltage regulator means sensing current-induced voltage at the second of said bipolar transistors, and generating an output in response to a given threshold of said last mentioned voltage.

18. The invention according to claim 17 wherein:

said first means further comprises a third transistor biased into conduction by said output of said first voltage regulator means to supply additional base drive to said first bipolar transistor; and said second means further comprises a fourth transistor biased into conduction by said output of said second voltage regulator means to supply additional base drive to said second bipolar transistor.

19. The invention according to claim 18 wherein:

said first voltage regulator means and said third transistor are connected to one said main terminal which is connected to the first of said bipolar transistors; and said second voltage regulator means and said fourth transistor are connected to the other said main terminal which is connected to said second bipolar transistor.

20. The invention according to claim 19 wherein:

said first voltage regulator means comprises amplifier means having one input connected to said one main terminal and having another input connected to a reference voltage setting said given threshold for said first bipolar transistor, and generating an output when the voltage level on its one said input rises above the voltage at its other said input; and said second voltage regulator means comprises amplifier means having one input connected to said other main terminal and having another input connected to said reference voltage setting said given threshold for said second bipolar transistor, and generating an output when the voltage level on its one said input rises above the voltage on its other said input.

21. The invention according to claim 20 wherein:

said first voltage regulator means further comprises first switch means for applying said output of said first mentioned amplifier means to said third transistor for biasing the latter into conduction when said first amplifier means generates said output; and said second voltage regulator means further comprises second switch means for applying said output of said second mentioned amplifier means to said fourth transistor for biasing the latter into conduction when said second amplifier means generates its said output.

22. The invention according to claim 21 wherein said base drive means comprises third switch means for applying base drive voltage to the respective bases of said first and second bipolar transistors for biasing them into conduction;

and further comprising gate means for actuating said switch means.

23. The invention according to claim 22 wherein:

said first and second switch means comprise a transistor biased into conduction from said gate means, whose conduction removes base drive from a pair of transistors whose nonconduction in turn enables application of said outputs of said first and second amplifier means respectively to said third and fourth transistors; and said third switch means comprises a transistor biased into conduction from said gate means, whose conduction biases another transistor into conduction, which conduction in turn supplies base drive to said first and second transistors.

24. The invention according to claim 22 wherein:

said third transistor comprises a FET having one of its source and drain connected to said one main terminal, the other of its source and drain connected to said base of said first bipolar power transistor at node connecting said base and said third switch means, and having its gate connected to said first switch means; and said fourth transistor comprises a FET having one of its source and drain connected to said other main terminal, the other of its source and drain connected to said base of said second bipolar power transistor at a point between said base and said third switch means, and having its gate connected to said second switch means.

25. A dual mode bidirectional Darlington-like transistor circuit for conducting current in both directions therethrough, including AC application, having a saturation mode and an active region mode, for optimizing ON state power dissipation, base drive requirements, and switching speed in applications subject to large overload currents for short periods of time, comprising:

a pair of bipolar transistors connected in series opposition between a pair of main power terminals connectable to a power source through a load;

a pair of diodes, each connected in reverse parallel with a respective one of said bipolar transistors, such that current flow in one direction between said main terminals traverses between the collector and emitter of the first of said bipolar transistors in an ON state and then from the anode to cathode of the second of said diodes, and such that current flow in the opposite direction between said main terminals traverses between the collector and emitter of the second of said bipolar transistors in an ON state and then from the anode to cathode of the first of said diodes;

base drive means for biasing said transistors into saturation for normally low level load currents less than a given value therethrough between said main terminals, whereby to afford low forward collector-emitter voltage drop;

third and fourth transistors, each connected between a respective one of said main terminals and the base of a respective one of said bipolar transistors; and means connected to said bipolar transistors and responsive to load currents above said given value to bias said third and fourth transistors into conduction to supply additional base driven from respective said main terminals through respective said third and fourth transistors to the bases of each respective said bipolar transistor and also keeping said bipolar transistors in their active region, out of saturation, to enable fast turn-off.

26. The invention according to claim 25 wherein said last mentioned means comprises voltage regulator means connected to said main terminals and sensing current-induced voltage thereat, and generating output levels dependent upon said voltage to drive said third and fourth transistors into conduction which in turn supply said additional base drive which allows higher current through said bipolar power transistors which in turn reduces the otherwise increased voltage thereacross and regulates said voltage at a given threshold due to the feedback control afforded by said level dependent output of said voltage regulator means upon said voltage.

* * * * *